United States Patent [19]
Pu et al.

[11] Patent Number: 5,843,847
[45] Date of Patent: Dec. 1, 1998

[54] METHOD FOR ETCHING DIELECTRIC LAYERS WITH HIGH SELECTIVITY AND LOW MICROLOADING

[75] Inventors: Bryan Pu; Hongching Shan, both of San Jose; Michael Welch, Livermore, all of Calif.

[73] Assignee: Applied Materials, Inc., Santa Clara, Calif.

[21] Appl. No.: 639,388

[22] Filed: Apr. 29, 1996

[51] Int. Cl.$^6$ ................................................ H01L 21/00
[52] U.S. Cl. ............................................ 438/723; 438/724
[58] Field of Search ................ 216/67; 438/723, 438/724

[56] References Cited

U.S. PATENT DOCUMENTS

| | | | |
|---|---|---|---|
| 4,654,112 | 3/1987 | Douglas et al. | 156/643 |
| 5,021,121 | 6/1991 | Groechel et al. | 156/643 |
| 5,234,537 | 8/1993 | Nagano et al. | 156/643 |
| 5,269,879 | 12/1993 | Rhoades et al. | 156/643 |
| 5,272,115 | 12/1993 | Sato | 437/228 |
| 5,290,383 | 3/1994 | Koshimizu | 156/345 |
| 5,302,236 | 4/1994 | Tahara et al. | 156/643 |
| 5,302,240 | 4/1994 | Hori et al. | 156/643 |
| 5,308,742 | 5/1994 | Ta | 430/313 |
| 5,322,590 | 6/1994 | Koshimizu | 156/626 |
| 5,338,399 | 8/1994 | Yanagida | 156/662 |
| 5,356,515 | 10/1994 | Tahara et al. | 156/643 |
| 5,445,710 | 8/1995 | Hori et al. | 156/643.1 |
| 5,514,247 | 5/1996 | Shan et al. | 156/643.1 |

*Primary Examiner*—Thi Dang
*Attorney, Agent, or Firm*—Ashok K. Janah; Peter J. Sgarbossa

[57] ABSTRACT

A method of etching a dielectric layer on a substrate with high etching selectivity, low etch rate microloading, and high etch rates is described. In the method, the substrate is placed in a process zone, and a plasma is formed from process gas introduced into the process zone. The process gas comprises (i) fluorocarbon gas for etching the dielectric layer and for forming passivating deposits on the substrate, (ii) carbon-oxygen gas for enhancing formation of the passivating deposits, and (iii) nitrogen-containing gas for etching the passivating deposits on the substrate. The volumetric flow ratio of fluorocarbon:carbon-oxygen:nitrogen-containing gas is selected to provide a dielectric to resist etching selectivity ratio of at least about 10:1, an etch rate microloading of <10%, and a dielectric etch rate of at least about 100 nm/min. Preferably, the volumetric flow ratio of fluorocarbon:carbon-oxygen:nitrogen-containing gas is selected so that the rate of formation of passivating deposits on the sidewalls of the freshly etched features is approximately equal to the rate of removal of the passivating deposits.

51 Claims, 4 Drawing Sheets

METHOD FOR ETCHING DIELECTRIC LAYERS WITH HIGH SELECTIVITY AND LOW MICROLOADING

BACKGROUND

The present invention relates to a process for etching substrates, and in particular, for etching dielectric layers, such as silicon dioxide, on semiconductor substrates.

In integrated circuit fabrication, it is often desirable to etch electrically insulative dielectric layers, such as silicon dioxide, undoped silicate glass, phosphosilicate glass (PSG), borophosphosilicate glass (BPSG), $Si_3N_4$, or TEOS deposited glass, that are used to electrically isolate devices or features formed on the substrate. For example, the dielectric layer can be deposited on a monocrystalline silicon substrate; a polysilicon layer on the substrate; or on antireflective or diffusion barrier layers, such as titanium silicide or titanium nitride. As another example, the dielectric layer can be deposited on electrically conductive interconnect lines that are used to electrically connect devices formed on semiconductor substrates. To etch the dielectric layer, resist material is deposited on the dielectric layer and patterned using photolithographic methods to the desired configuration of holes or lines. Holes are etched though the exposed portions of the insulative dielectric layers to the underlayers, such as silicon, polysilicon, titanium silicide, or titanium nitride layers. The etched holes are filled with electrically conductive material to form vertical electrically conductive interconnects, commonly known as contact holes or vias, which connect devices formed on the substrate or interconnect lower levels of interconnect lines to upper levels of interconnect lines.

In conventional etching processes, the dielectric layer is etched using a plasma of fluorocarbon gases, such as for example, $CHF_3$, $CF_4$, and argon. However, such gas compositions do not allow simultaneous control of both etching selectivity ratio and etch rate microloading. Tailoring the gas composition to provide high etching selectivity often results in high etch rate microloading, and vice versa. By etching selectivity ratio it is meant the ratio of the rate of etching of the dielectric layers to the rate of etching of the overlying resist layer, or the underlying silicon polysilicon, titanium silicide, or titanium nitride layer. It is desirable for the dielectric etch rate to be greater than the etch rate of the adjacent layers to etch the dielectric without excessive etching of the overlying resist layer, and without etching through the underlayers. Etch rate microloading is a measure of the relative difference in etch rates for large and small sized features, and should be less than 10%, to obtain uniformly sized etched features that stop on the underlayers. Conventional etching processes that provide low etch rate microloading, often result in dielectric to resist etching selectivity ratios of typically less than about 5:1. However, modern integrated circuits often require etching selectivities of greater than 5:1 with respect to the resist; greater than 20:1 with respect to polysilicon, $WSi_x$, and $TiSi_x$; and greater than 40:1 with respect to the diffusion barrier or antireflective layers.

In order to provide highly selective etching and reduced microloading, fluorocarbon gases containing a large number of carbon and fluorine atoms, such as $C_4F_8$ and $C_2F_6$, are used in combination with a carbon-containing gas (which increases the carbon content of the etchant gas), such as for example, $CHF_3$, CO, and argon. Such gas compositions provide high etching selectivity because dissociated carbon in the etchant gas forms complex polymeric byproducts that deposit as "passivating" layers on the sidewalls of the etched features, and on the underlayer, and overlayer to reduce etching of the same. The passivating layer on the sidewall of the etched features limits etching of the sidewalls and prevents "isotropic" etching. Although vertical "anisotropic" etching is desirable, excessive deposition of passivating polymers on the sidewalls of the etched features is undesirable and can result in a sloped cross-sectional profile for the etched features. Also, the high carbon content of the gas mixture can result in low dielectric etching rates that typically range from about 50 to 75 nm/min.

Conventional gas compositions also often cause high profile microloading with the cross-sectional profile of the holes etched in the dielectric layer varying as a function of the distance between the etched holes. This occurs when the passivating deposits formed on the sidewalls of narrow diameter holes are removed at higher rates than the wide diameter holes, because plasma ions are channeled between, and bounce-off, the sidewalls of the narrow holes to excessively etch the passivating layer thereon. In contrast, etching of passivating deposits on sidewalls of wide holes is not as high because of lower channeling effects. This results in high profile microloading with the cross-sectional shape of the holes varying as a function of the diameter of the holes.

Accordingly, there is a need for an etching process that provides high etching selectivity ratio, low etch rate microloading, and high etching rates. It is also desirable for the etching process to provide reduced profile microloading and substantially anisotropic etching by controlling the amount of passivating deposits formed on the sidewalls of the etched features.

SUMMARY

The present invention is directed to a method of etching a substrate having a dielectric layer with resist material thereon, with high etching selectivity, low etch rate microloading, and high etch rates. In the method, the substrate is placed in a process zone, and a plasma is formed from process gas introduced into the process zone. The process gas comprises (i) fluorocarbon gas for etching the dielectric layer and for forming passivating deposits on the substrate, (ii) carbon-oxygen gas to enhance formation of passivating deposits on the substrate, and (iii) nitrogen-containing gas for removing the passivating deposits formed on the substrate. The volumetric flow ratio of fluorocarbon:carbon-oxygen:nitrogen-containing gas is selected to provide a dielectric to resist etching selectivity ratio of at least about 10:1, an etch rate microloading of less than about 10%, and a dielectric etch rate of at least about 100 nm/min. Preferably, the volumetric flow ratio is selected so that the rate of formation of passivating deposits on etched features of the substrate is approximately equal to the rate of removal of the passivating deposits. Also, the gas composition can be tailored to provide a dielectric to underlayer etching selectivity ratio of at least 20:1, where the underlayer is, for example, monocrystalline silicon, polysilicon, titanium silicide, anti-reflective, or diffusion barrier layers.

A preferred etchant gas composition comprises a mixture of a first fluorocarbon gas comprising hydrogen, and a second fluorocarbon gas absent hydrogen. Preferably, the first fluorocarbon gas is selected from the group consisting of $CH_3F$, $CHF_3$, $C_2HF_5$, $CH_2F_2$, and $C_2H_4F_6$, and the second fluorocarbon gas is selected from the group consisting of $CF_4$, $C_2F_6$, $C_3F_8$, $C_4F_8$, and $C_4F_{10}$. The nitrogen-containing gas is preferably absent fluorine, and can comprise $N_2$, $N_2O$, or $NO_x$, of which $N_2$ is preferred. An inert gas capable of being activated by the plasma to sputter material from the substrate can be added to the process gas to enhance etch rates and etch selectivity. The inert gas can comprise argon, xenon, neon, krypton, or helium, of which argon is preferred.

DRAWINGS

These and other features, aspects, and advantages of the present invention will be better understood from the following drawings, description and appended claims, which illustrate examples of the invention, where:

DESCRIPTION

The etching process of the present invention is useful for etching a dielectric layer 20 on a substrate 25, as shown in FIGS. 1a–1d, with high etching selectivity and good etch rates. The substrate 25 can be made of any material, such as glass, ceramic, metal, polymer, or semiconductor substrates, such as a silicon or gallium arsenide wafers. The dielectric layer 20 on the substrate 25 typically comprises a layer of silicon oxide, phosphosilicate glass (PSG), or borophosphosilicate glass (BPSG), having thickness of about 400 to 800 nm. The dielectric layer 20 can also comprise plurality of layers, such as for example, a silicon oxide layer having a thickness of about 100 to 500 nm, covered by a 300 to 800 nm BPSG layer. Although the etching method of the present invention is illustrated for etching of dielectric layers, the etching method can also be used to etch films which include non-oxide layers such as silicide, nitride, or boride layers, for example $Ta_2O_5$, $TiO_2$, TiB, $WSi_x$, and $MoSi_x$. Thus, the present invention should not be limited to etching of dielectric layers.

Figure 1A:
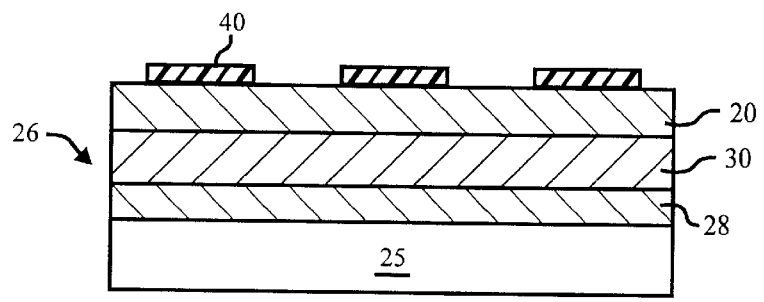
FIG. 1a is a schematic in vertical cross-section of a dielectric layer covering a substrate.
Figure 1B:
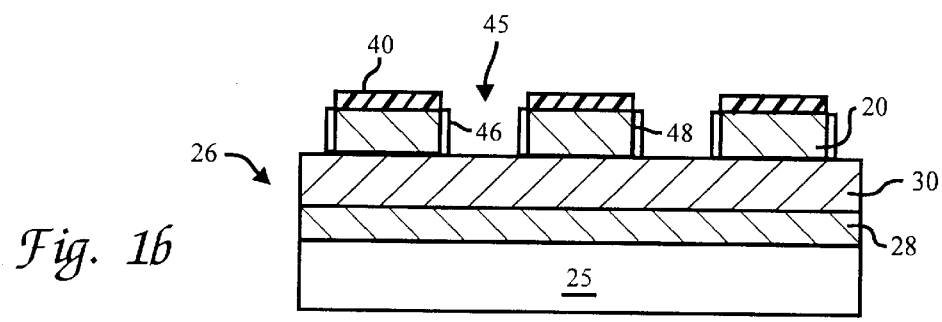
FIG. 1b is a schematic in vertical cross-section of the substrate of FIG. 1 a after etching of the dielectric layer showing substantially anisotropically etched contact holes.
Figure 1C:
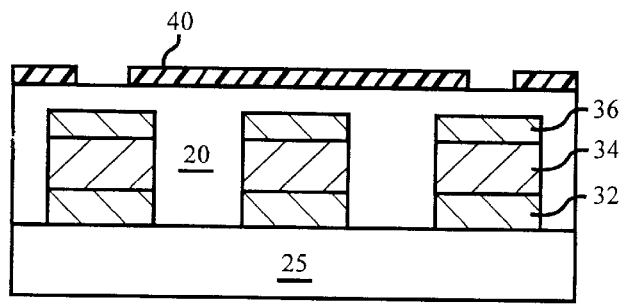
FIG. 1c is a schematic in vertical cross-section of a dielectric layer covering electrically conductive interconnection lines on a substrate.
Figure 1D:
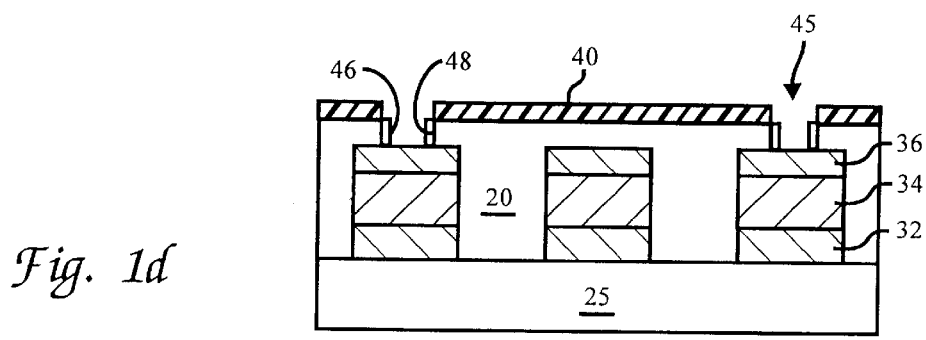
FIG. 1d is a schematic in vertical cross-section of the substrate of FIG. 1c after etching of the dielectric layer showing substantially anisotropically etched vias.

The dielectric layer 20 is used to electrically isolate devices or interconnect lines formed on the substrate 25. For example, the dielectric layer 20 can be deposited on an underlayer 26, such as a contact resistance reducing layer, such as titanium silicide, a doped polysilicon layer 28, or a diffusion layer 30 to electrically isolate the underlayer 26, as shown in FIG. 1a. Dielectric layers 20 are also used to electrically isolate etched interconnect lines that typically include (i) a lower diffusion barrier layer 32, such as titanium, tungsten, titanium-tungsten or titanium nitride; (ii) an electrically conductive layer 34 comprising aluminum, copper and silicon; and (iii) an anti-reflective layer 36, such as silicon, titanium nitride or titanium-tungsten, as shown in FIG. 1c, each of the layers being typically from about 200 nm to about 1000 nm thick.

In conventional photolithographic processes, a photoresist 40, such as "RISTON," manufactured by duPont de Nemours Chemical Company, is applied on the dielectric layer 20, to a thickness of about 0.4 to about 1.3 micron, and the features 45 to be etched in the insulative dielectric layer, such as contact holes or vias, are defined by exposing the resist to a pattern of light through a mask that corresponds to the desired configuration of features 45. The dielectric layer 20 below the unexposed portions of the resist are etched in the etching process. During the etching process, polymeric passivating deposits 46 are typically formed on the sidewalls 48 of the etched features 45. The etched features 45 are typically sized from about 0.2 to about 10 microns, and more typically about 0.4 to 2 microns, and the spacing between the features is typically from 0.2 microns to 10 microns.

Figure 2:
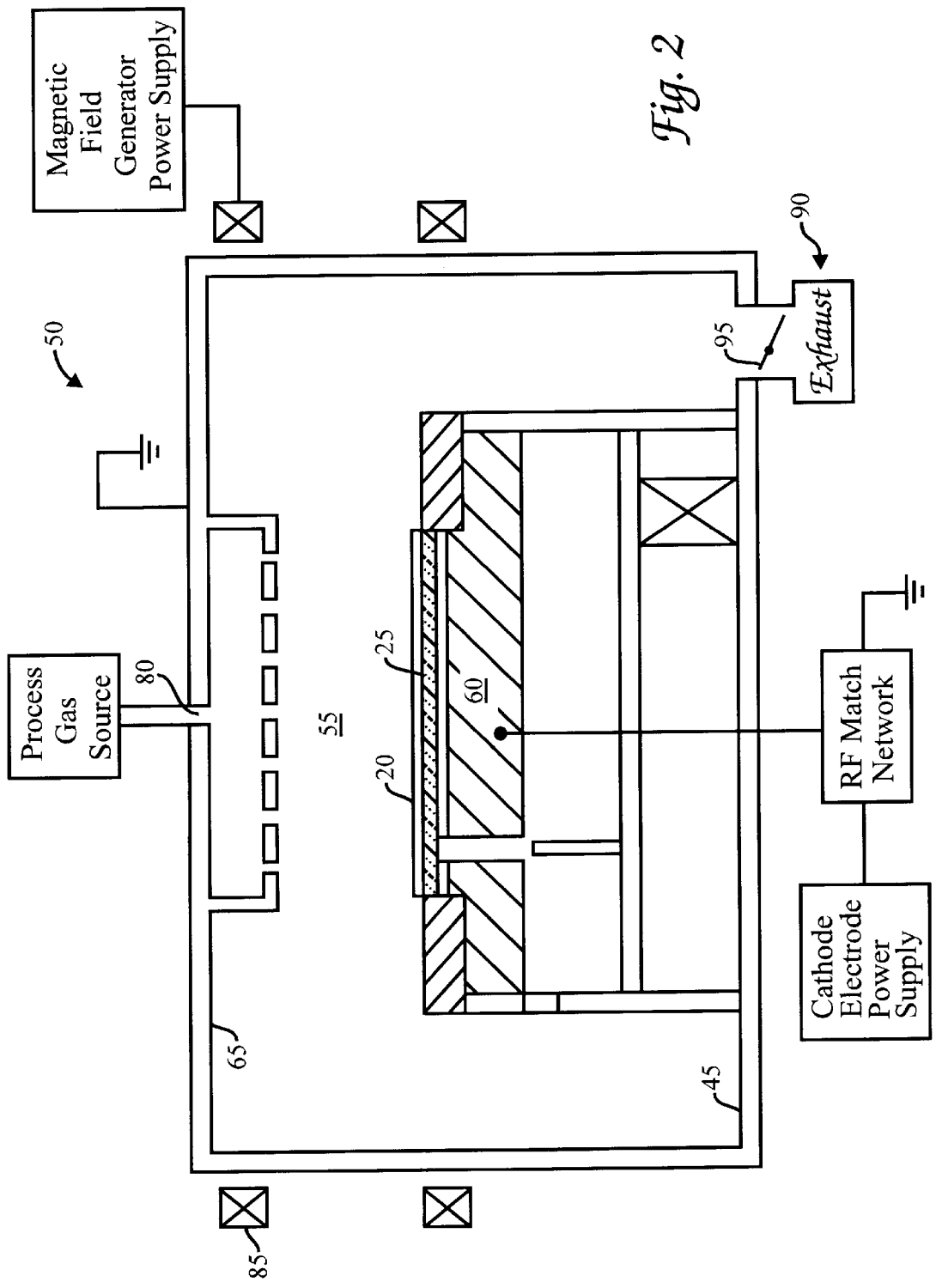
FIG. 2 is a schematic view in vertical cross-section of a process chamber suitable for practicing the etching process of the present invention.

The dielectric layer 20 on the substrate 25 is etched in a process chamber 50, such as for example, a MxP+OXIDE ETCH chamber, commercially available from Applied Materials Inc., Santa Clara, Calif., as shown in FIG. 2. The particular embodiment of the process chamber 50 shown herein, is suitable for processing of semiconductor substrates 25, is provided only to illustrate the invention, and should not be used to limit the scope of the invention. For example, the etching process of the present invention can be used to etch any substrate 25, and can be used for manufacturing processes other than semiconductor fabrication.

To perform the process, the chamber 50 is evacuated to a pressure of less than about 1 mTorr, and a substrate 20 is transferred to a plasma zone 55 of the chamber 50 from a load lock transfer chamber (not shown) maintained at vacuum. Preferably, the plasma zone 55 comprises a volume of at least about 5,000 cm$^3$, and more preferably from about 10,000 to about 50,000 cm$^3$. The substrate 20 is placed on a support that also serves as a cathode electrode 60, and the sidewalls of the chamber 50 are electrically grounded to form an anode electrode 65. The substrate can be held in place during the etching process using a mechanical or electrostatic chuck (not shown) with grooves in which a coolant gas, such as helium, is held to control the temperature of the substrate 25.

Process gas is introduced into the chamber through a gas distributor 80 peripherally disposed about the substrate 25, and the chamber 50 is maintained at a pressure ranging from about 1 to about 1000 Mtorr, and more typically from 10 to 300 mTorr. An electric field is maintained in the plasma zone 55 to form a plasma from the process gas (i) inductively by applying an RF current to an inductor coil (not shown) encircling the process chamber, (ii) capacitively by applying an RF current to the cathode and anode electrodes 60, 65 in the process chamber 50, or (iii) both inductively and capacitively. In reactive ion etching (RIE) processes, the plasma is typically capacitively generated by applying an RF voltage at a power level of from about 100 to about 2000 Watts to the cathode electrode 60, and by electrically grounding the anode electrode 65. Alternatively, an RF current at a power level of from about 750 Watts to about 2000 Watts can be applied to an inductor coil to inductively couple energy into the chamber to generate the plasma in the plasma zone 55. The frequency of the RF current applied to the process electrodes 60, 65 or inductor coil is typically from about 50 Khz to about 60 MHz, and more typically about 13.56 MHz.

The plasma can also be enhanced using electron cyclotron resonance or magnetically enhanced reactors, in which a magnetic field generator 85, such as a permanent magnet or electromagnetic coils, is used to applied a magnetic field in the plasma zone 55 to increase the density and uniformity of the plasma in the plasma zone 55. Preferably, the magnetic field comprises a rotating magnetic field with the axis of the field rotating parallel to the plane of the substrate 25, as described in U.S. Pat. No. 4,842,683, issued Jun. 27, 1989, which is incorporated herein by reference. The magnetic field in the chamber 50 should be sufficiently strong to increase the density of the ions formed in the plasma, and sufficiently uniform to reduce charge-up damage to features such as CMOS gates. Generally, the magnetic field as measured on a surface of the substrate is lees than about 500 Gauss, more typically from about 10 to about 100 Gauss, and most typically from about 10 Gauss to about 30 Gauss.

Spent process gas and etchant byproducts are exhausted from the process chamber 50 through an exhaust system 90 capable of achieving a minimum pressure of about $10^{-3}$ mTorr in the process chamber 50. A throttle valve 95 is provided in the exhaust for controlling the pressure in the chamber 50. Also, an optical endpoint measurement technique is typically used to determine completion of the etching process for a specific layer by measuring the change in light emission intensity of a particular wavelength corresponding to a detectable gaseous species. A sudden decrease or increase in the amount of the detectable species, such as for example, CO or CN, that results from chemical reaction of the process gas with the silicon dioxide or polysilicon layer indicates completion of etching of the dielectric layer 20 and start of etching of the underlayer.

The etching process of the present invention provides high etch rates and highly selective etching of the dielectric layers 20 on the substrate 25. The process gas used in the etching process comprises (i) fluorocarbon gas for etching the dielectric layer 20 and forming passivating deposits 46 on the substrate 25, (ii) carbon-oxygen gas for enhancing formation of passivating deposits 46, and (iii) nitrogen-containing gas for etching the passivating deposits 46 on the substrate 25. In addition, an inert-gas can be added to the process gas to provide sputtering ions that sputter and remove material from the substrate 25. The nature of these gases and preferred volumetric flow ratios of the gases will now be described.

The fluorocarbon gas is capable of forming fluorine-containing species that etch the dielectric layer 20 on the substrate 25. For example, a silicon dioxide layer is etched by fluorine containing ions and neutrals to form volatile $SiF_x$ species that are exhausted from the chamber 50. Suitable fluorocarbon gases include carbon, fluorine, and optionally hydrogen, such as for example, $CF_3$, $CF_4$, $CH_3F$, $CHF_3$, $CH_2F_2$, $C_2H_4F_6$, $C_2F_6$, $C_3F_8$, $C_4F_8$, $C_2HF_5$, and $C_4F_{10}$. In a preferred aspect of the present invention, the fluorocarbon gas comprises a mixture of fluorocarbon species selected from (i) a first group of hydrogen-containing fluorocarbons, such as for example $CH_3F$, $CHF_3$, $C_2HF_5$, $CH_2F_2$, and $C_2H_4F_2$; and (ii) a second group of fluorocarbons that are absent hydrogen, such as $CF_4$, $C_2F_6$, $C_3F_8$, $C_4F_8$ and $C_4F_{10}$. Although the gas chemistry is not fully understood, it is believed that in general the second group of fluorocarbons provide increased amounts of free carbon and $CF_2$ radicals that result in anisotropic etching and increased etching selectivity. However, excessive amounts of fluorocarbon gas from the second group provides low etch rates because of the high carbon content. It is further believed that the first group of fluorocarbons (with the exception of $CH_3F$) provide increased etch rates and lower etching selectivity, because these fluorocarbons provide hydrogen species that combine with free carbon radicals to form gaseous hydrocarbons that are exhausted from the chamber thereby limiting the amount of carbon available to form passivating deposits, and increasing amounts of fluorine species available for etching the dielectric 20. It has been discovered that a combination of gases selected from the first and second groups of fluorocarbons provides optimum etch rates and etching selectivity ratios. For example, a preferred combination of gases include $CHF_3$ gas from the first group, and $C_4F_8$ gas from the second group, in a volumetric flow ratio of about 1:1 to about 10:1 and more preferably from 1:1 to 6:1, and most preferably about 4:1.

The carbon-oxygen gas is used to enhance formation of carbon-containing species that form passivating deposits 46 on the substrate 25, and to control the rates of etching of silicon-containing underlayers. The carbon-oxygen gas typically reacts with fluorine species to form volatile $COF_2$ to reduce the fluorine concentration in the process chamber 50 and consequently reduce etching of the silicon containing underlayers. In addition, the carbon-oxygen gas enhances the formation of free carbon species that react with other species, such as nitrogen, fluorine and boron to form polymers that deposit on the sidewalls of the etched features as passivating deposits 46. For example, $CF_2$ radicals polymerize to form polymers that deposits on the sidewalls 48 of the freshly etched features 45 as a passivating deposit 46 that improves vertical anisotropic etching. Thus, excessively high flow rates of the carbon-oxygen gas can cause excessive passivating deposits 46 to form on the substrate 25 and lower the dielectric etch rate. For these reasons, the flow rate of carbon-oxygen gas is maintained lower than, or substantially equal to, the flow rate of the fluorocarbon gas to provide sufficient fluorine-containing species to rapidly etch the substrate 25, while providing high dielectric to underlayer etching selectivity, and anisotropic etching. Suitable carbon-oxygen gases include for example, CO, HCOOH, and HCHO, of which CO is preferred.

The nitrogen-containing gas, for example $N_2$, $NO_2$, and $NO_x$, provides unexpected results in combination with the fluorocarbon and carbon-oxygen gases. As described above, the fluorocarbon and carbon-oxygen components dissociate to form $CF_2$ species that form polymeric passivating deposits 46 on the sidewalls 48 of the etched features 45. It is believed that the nitrogen-containing gas reacts with some of the $CF_2$ radicals to form volatile CN radicals which are exhausted from the process chamber 50. The resultant increase in oxygen species in the plasma zone reacts with free carbon to reduce the amount of passivating deposits 46 formed on the substrate 25, reduce etch rate microloading, and prevent deposition of excessively thick passivating deposit layers that can stop the etching process. It is also believed that nitrogen species react with F and $CF_x$ species to form $NF_3$ species that etch the passivating deposits 46 off the substrate 25, even though the fluorocarbon and carbon-oxygen gases provide relatively large amounts of free carbon and $CF_2$ radicals that reduce dielectric etch rates. Thus, it is preferred to use nitrogen-containing gases which are absent fluorine, such as $N_2$, $NO_2$, or $NO_x$ where x is from about 1 to about 2, of which $N_2$ is preferred. Preferably, the volumetric flow ratio of fluorocarbon to nitrogen-containing gas is from about 5:1 to about 1:5, and more preferably from about 3:1 to about 1:3, and most preferably from about 2:1 to about 1:2.

For optimal etching results, the volumetric flow ratio of fluorocarbon:carbon-oxygen:nitrogen-containing gas is selected so that the rate of formation of passivating deposits 46 on the sidewalls 48 and bottom of the freshly etched features 45 is approximately equal to the rate of removal of the passivating deposits 46. This provides high etching selectivity ratios, for example, a dielectric to resist etching selectivity ratio of at least about 10:1, while simultaneously etching the dielectric layer 20 at a high etch rate of at least about 100 nm/min, and more typically from 200 to 500 nm/min, with reduced etch rate microloading. When the substrate 25 comprises an underlayer 26 of material below the dielectric layer 20, such as a polysilicon, monocrystalline silicon, titanium silicide, titanium nitride, or silicon nitride layer, the volumetric flow ratio of fluorocarbon:carbon-oxygen:nitrogen-containing gas can be tailored to increase etching selectivity ratios for specific combinations of materials, such as for example, the etching selectivity of etching dielectric to resist, polysilicon, diffusion barrier layers, titanium silicide layers, or anti-reflective layers. In particular the volumetric flow ratio of fluorocarbon:carbon-oxygen:nitrogen-containing gas is selected so that the etching selectivity ratio of dielectric to polysilicon, titanium silicide, or titanium nitride is at least about 20:1, and more preferably at least about 30:1. The volumetric flow ratio of fluorocarbon:carbon-oxygen:nitrogen-containing gas can also be adjusted so that the sidewalls 48 of the etched features 45 have smooth surfaces that form angles of at least about 85° with the surface of the dielectric layer 20 on the substrate 25. For example, volumetric flow ratios of fluorocarbon:carbon-oxygen:nitrogen-containing gas that provide high etching selectivity, reduced etch rate microloading, and excellent etch rates, range from about 7:8:4 to about 3:4:4, more preferably from about 6:7:4 to about 4:5:4. Although preferred volumetric flow ratios are recited herein, it should be understood that the volumetric flow ratios can be tailored for different combinations of materials, and feature geometry, such as feature aspect ratios, to achieve specific etching selectivities, etch rate microloading, or etch rates without deviating from the scope of the present invention.

Preferably, inert gas is added to the process gas to form ionized sputtering species that sputter-off the passivating deposits 46 on the sidewalls 48 of the freshly etched features 45. The inert gas also ionizes to form ionized metastable states that enhance dissociation of the process gas. Thus, it is also desirable for the inert gas to have a wide range of excitation energies, so that energy transfer reactions which promote dissociation of the process gas can occur between the excited inert gas and the process gas. Suitable inert gases include argon, helium, neon, xenon, and krypton, of which argon is preferred. Sufficient inert gas is added to the process gas to assist in sputtering the passivating deposits 46 off the substrate 25, and to enhance disassociation of the process gas. However, excessive flow of inert gas causes excessive sputtering of the resist on the substrate 25, resulting in resist faceting, etching of the dielectric layer 20 underlying the resist, and high profile microloading. Thus, the volumetric flow ratio of inert gas to process gas is preferably from about 3:1 to about 1:2.

One preferred composition of process gas, suitable for etching silicon oxide layers on a silicon substrate 25 with highly selective etching, comprises $CHF_3$, $C_4F_8$, CO, $N_2$, and argon. For the volume of the process chamber 50 described herein, (i) a suitable flow rate of $CHF_3$ is from about 10 to about 60 sccm, and more preferably from about 20 to about 50 sccm; (ii) a suitable flow rate of $C_4F_8$ is from about 0.5 to about 40 sccm, and more preferably from about 2 to about 20 sccm; (iii) a suitable flow rate of CO is from about 10 to about 90 sccm, and more preferably from about 20 to about 60 sccm; (iv) a suitable flow rate of $N_2$ is from about 5 to about 80 sccm, and more preferably from about 10 to about 40 sccm; and (v) a suitable flow rate of argon is from about 50 to about 300 sccm, and more preferably from about 100 to about 250 sccm. Because actual flow rates are dependent upon the volume of the chamber 50, the invention should not be limited to the flow rates recited herein.

The etching process of the present invention provides high selective etching of dielectric layers 20 without sacrificing etch rate microloading and dielectric etching rates. By etching selectivity ratio, it is meant the ratio of the rate of etching of the dielectric layer 20 to the rate of etching of adjacent layers of other materials, that include the underlying anti-reflective, diffusion barrier, titanium silicide, or polysilicon layers, and overlying resist layers. The combination of the high etch rates, low microloading, and high etching selectivity is obtained by balancing the rate of deposition and removal of passivation species from the substrate 25, and by controlling the amount of fluorine-containing species available for etching the dielectric layer 20. While excessive passivating deposits 46 reduce overall dielectric etch rates and increase etch rate microloading, suppression of the deposition or formation of polymer typically reduces etching selectivity. The combination of fluorocarbon, carbon-oxygen, nitrogen-containing gas, and inert gas, of the present invention provides the unexpected advantages of high etch rates, low etch rate microloading, and high etching selectivity. In particular, the present etching process provides etching selectivity ratios of the dielectric to resist of at least about 10:1, of dielectric to polysilicon of at least about 20:1, and of dielectric to $TiSi_x$ of at least about 30:1. In addition, high etch rates of at least about 100 nm/min, and more typically at least about 300 nm/min are obtained, while maintaining etch rate microloading to less than about 10%.

EXAMPLES

The following examples illustrate use of the present invention for etching dielectric layers 20 on semiconductor substrates 25. However, the apparatus and method can be used in other applications as would be apparent to those skilled in the art, and the scope of the present invention should not be limited to the illustrative examples provided herein.

The substrates 25 used were silicon wafers of 200 mm (8 inch) diameter, coated successively with a polysilicon layer, a 0.05 micron layer of $TiS_x$; and a BPSG layer having a thickness of about 1.5 microns. The substrate 25 was placed on the cathode 60 of an MxP+OXIDE ETCH chamber 50, and the chamber 50 was maintained at a pressure of from about 80 mTorr. Process gas comprising the particular gas compositions described below was introduced into the process chamber 50. Thereafter, a plasma is generated in the plasma zone 55 to form an etchant gas that etches the dielectric layer 20 on the substrate 25. The plasma was generated by applying a RF voltage to the process electrodes having a power level of about 1100 Watts. The plasma was enhanced by applying a rotating magnetic field of about 30 Gauss to the plasma zone 55.

The substrate 25 was cooled or heated to temperatures sufficiently high to volatilize etchant byproducts, and sufficiently low so that the thin layer of passivating deposit 46 on the sidewalls 48 of freshly etched features 45 is not volatilized. Typically, the substrate 25 was cooled to a temperature of 15° C. using a flow of helium on the backside of the substrate 25 maintained at a pressure of about 14 mTorr. The chamber wall was heated to a temperature of 15° C. to form polymer deposits on the wall. The etching process was performed for a sufficient time to etch through the insulative dielectric layers 20 on the substrate 25, and terminated using an optical endpoint measurement technique. After etching, residual resist is burned or ashed off using an oxygen plasma maintained at conventional process conditions.

SEM photos of the etched wafers were used to measure the (i) dielectric etch rate, (ii) the etching selectivity ratio of dielectric etching to $TiSi_x$, polysilicon, or photoresist etching, (iii) etch rate uniformity, (iv) the sidewall 48 profile angle, and (v) the % etch rate microloading. Etch rates were calculated by measuring the depth of the features 45 etched in the wafers. The etching selectivity ratio was calculated from the ratio of the etch rate of the dielectric layers 20 to the etch rate of the $TiSi_x$, polysilicon, or photoresist layers. The etch rate uniformity was calculated using at least 15 different measured points, by the formula:

$$\text{Uniformity} = \frac{(\text{maximum etch rate} - \text{minimum etch rate})}{(2 \text{ mean etch rate})}$$

The % etch rate microloading is a measure of the difference in etch rates obtained when etching features having different sizes on the substrates, and was calculated as a percent value from the formula:

$$\% \text{ Microloading} = \frac{\left(\begin{array}{c}\text{Large Feature Etch Rate} - \\ \text{Small Feature Etch rate}\end{array}\right)}{\text{Etch Rate for large features}} \times 100\%$$

In the examples below, percent etch rate microloading was measured for large holes having diameters of about 1.1 microns and small holes having diameters of about 0.5 microns, the etch rates being averaged for the center and peripheral edge of the substrates 25.

EXAMPLES 1–6

To compare the etching process of the present invention to conventional etching processes having different gas compositions, several experiments were conducted as shown in Table I.

TABLE I

PROCESS GAS COMPOSITIONS AND RESULTS OF EXAMPLES 1–6

| Example | Process Gas | Etch rate (nm/min) | Oxide to $TiSi_x$ Selectivity | Oxide to Polysilicon Selectivity | Oxide to Resist Selectivity | % Microloading | Profile (°) |
|---|---|---|---|---|---|---|---|
| 1 | $CHF_3/CF_4/$Ar | 400–700 | <15 | 10–12 | 2–5 | <10% | 84–87 |
| 2 | $CO/CHF_3/$ $CF_4/Ar$ | 350–450 | 15–30 | 12–14 | 3–5 | ~10% | 86–88 |
| 3 | $CO/C_4F_8/$Ar | 250–350 | >60 | 20–25 | 10–15 | ~7% | 86–88 |
| 4 | $CF_4/CO/$ $C_4F_8/Ar$ | >500 | N/A | <12 | 3–4 | <10% | N/A |
| 5 | $CHF_3/CO$ $C_4F_4/Ar$ | 350–400 | >60 | 30–35 | 15–20 | >50% | 84–87 |
| 6 | $CHF_3/N_2/$ $CO/C_4F_8/$ Ar | 350–550 | 40–60 | 15–20 | 10–12 | <10% | 85–88 |

These examples demonstrate the advantages of the etching process of the present invention. In particular, Example 6 demonstrate that a process gas comprising $CHF_3/N_2/CO/C_4F_8/Ar$, according to the present invention, provides high etch rates greater than 350 nm/minute, and excellent etching selectivity ratios for dielectric etching that exceeded 40:1 for titanium silicide, 15:1 for polysilicon, and 10:1 for photoresist. The profiles of the features 45 etched in the dielectric layer 20 had angles of from about 85° to about 88°, and the % microloading was less than 10%.

In contrast the other listed etching gas compositions produced either lower etching selectivity ratios, such as for Examples 1 and 2, or lower etch rates, such for example 3. Example 4 produced the highest etch rates but provided unacceptably low dielectric to photoresist etching selectivity ratios, and the relatively resist etching rate resist resulted in excessive polymeric deposits formed on the chamber walls. Example 5 provided high etch rates and good etching selectivity, however, the % microloading of >50% was unacceptable.

EXAMPLE 7–15

In examples 7–15, the volumetric flow ratio of $CHF_3$ to nitrogen was optimized using a factorial design study involving a $2^3$ orthogonal matrix. Three flow rates were selected for each of the two process variables, as shown in Table II.

TABLE II

ORTHOGONAL MATRIX CONDITIONS

| | Level | | |
|---|---|---|---|
| Factors | I | II | III |
| $CHF_3$ Flow rate (sccm) | 0 | 20 | 40 |
| $N_2$ Flow rate (sccm) | 0 | 20 | 40 |

In these experiments, the pressure in the chamber 50 was maintained at 80 mTorr, and the magnetic field maintained at 30 Gauss. The cathode 60 and chamber wall temperature was held at 15° C. Helium was flowed at a pressure of 14 Torr on the backside of the wafer. The flow rate of $C_4F_8$ was maintained at 5 sccm, the CO flow rate maintained at 30 sccm, and the argon flow rate maintained at 200 sccm. A current at a power level of 1100 watts was applied to the cathode electrode 60 to generate an RF bias for forming a plasma in the chamber 50.

Figure 3:
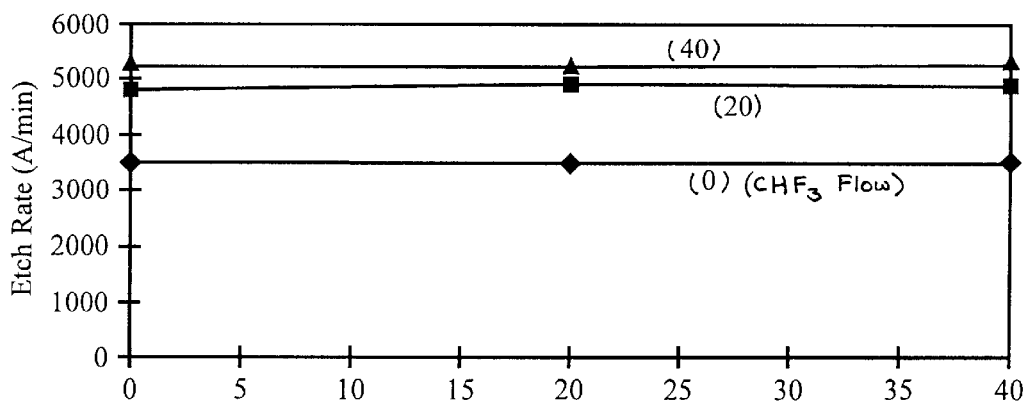
FIG. 3 is a graph showing the change in the rate of etching of a dielectric layer for increasing flow rates of $CHF_3$ and $N_2$ gas.
Figure 4:
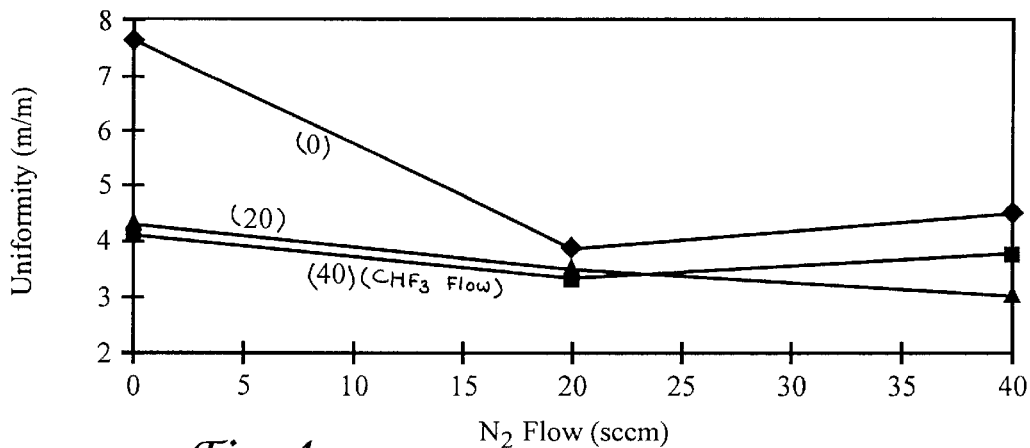
FIG. 4 is a graph showing the change in dielectric etching uniformity across the substrate for increasing flow rates of $CHF_3$ and $N_2$ gas.
Figure 5:
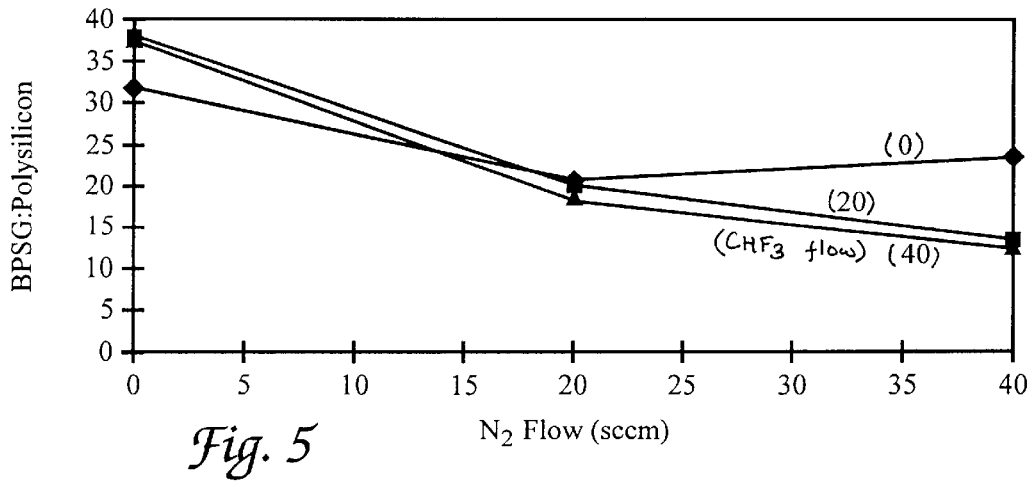
FIG. 5 is a graph showing the change in BPSG to polysilicon etching selectivity ratio for increasing flow rates of $CHF_3$ and $N_2$ gas.
Figure 6:
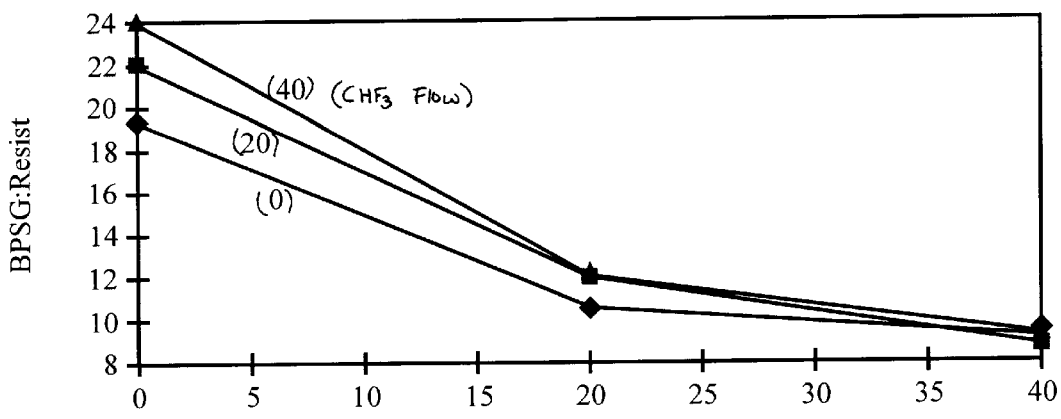
FIG. 6 is a graph showing the change in BPSG to photoresist etching selectivity ratio for increasing flow rates of $CHF_3$ and $N_2$ gas.
Figure 7:
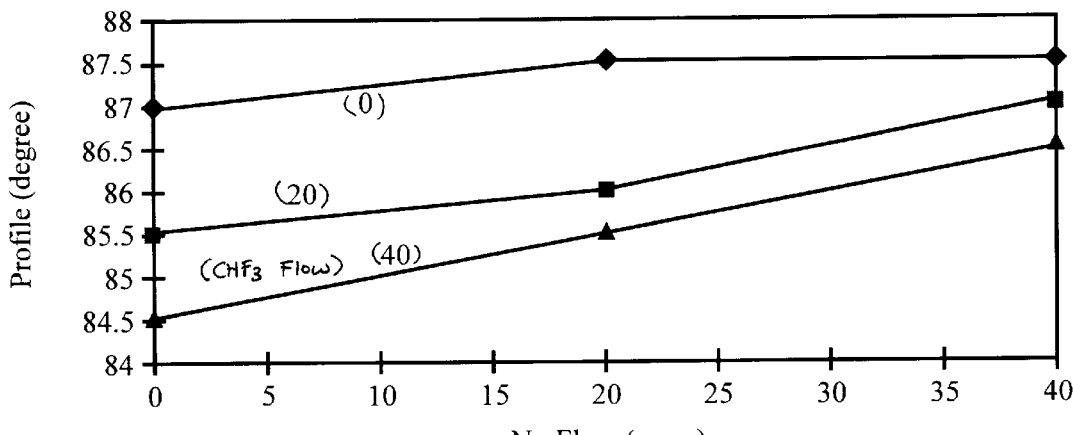
FIG. 7 is a graph showing the change in profile angle of features etched through the dielectric layer for increasing flow rates of $CHF_3$ and $N_2$ gas.
Figure 8:
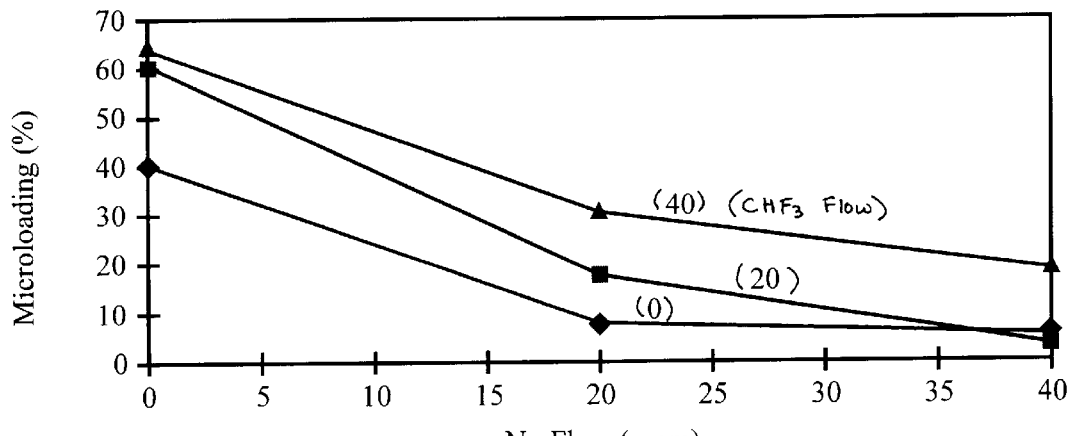
FIG. 8 is a graph showing the change in % microloading for increasing flow rates of $CHF_3$ and $N_2$ gas.

The results of Examples 7–15 are shown in Table III. Also, FIGS. 3 to 8 show the change in etch rate, uniformity, selectivity ratio for dielectric to polysilicon or photoresist, profile angle, and % microloading, as a function of the $N_2$ and $CHF_3$ volumetric flow rates. FIG. 3 demonstrates that the etch rate increases for higher flow rates of $CHF_3$. FIG. 4 demonstrates that the non-uniformity in the etch rate decreases for higher flow rates of $CHF_3$, however an increase in the flow rate of $N_2$ appears to decrease overall etch non-uniformity. FIG. 5 demonstrates that the etching selectivity ratio for etching of dielectric relative to polysilicon decreases with an increase in the flow rate of $N_2$. FIG. 6 demonstrates that the etching selectivity ratio for etching of dielectric relative to photoresist decreases substantially for an increase in the flow rate of $N_2$, and also for decreasing flow of $CHF_3$. FIG. 7 demonstrates that the profile angle of the sidewalls 48 of the etched features 45 decreases for higher flow rates of $CHF_3$, and increases for increased flow of $N_2$. FIG. 8 demonstrates that the % microloading decreases substantially with the addition of $N_2$ to the process gas.

TABLE III

PROCESS GAS COMPOSITIONS AND RESULTS OF EXAMPLES 7–15

| Example No. | $CHF_3$ Flow rate (sccm) | $N_2$ Flow rate (sccm) | Etch rate (nm/min) | Oxide to Polysilicon Etch Selectivity Ratio | Oxide to Resist Etch Selectivity Ratio | Etch Uniformity (m/m) | Profile (°) | RIE lag |
|---|---|---|---|---|---|---|---|---|
| 7 | 0 | 0 | 349 | 31.5 | 19.4 | 7.6 | 87 | 40 |
| 8 | 0 | 20 | 360 | 19.6 | 10.6 | 3.9 | 87.5 | 8 |
| 9 | 0 | 40 | 352 | 23.8 | 9.3 | 4.4 | 87.52 | 6 |
| 10 | 20 | 0 | 469 | 37.8 | 21.8 | 4.1 | 85.5 | 60 |
| 11 | 20 | 20 | 481 | 16.3 | 11.4 | 3.3 | 86.5 | 3 |
| 12 | 20 | 40 | 474 | 13.4 | 8.9 | 3.7 | 87 | 3 |
| 13 | 40 | 0 | 513 | 37.7 | 23.9 | 4.3 | 84.5 | 63.5 |
| 14 | 40 | 20 | 523 | 16.8 | 12 | 3.5 | 85.5 | 30.5 |
| 15 | 40 | 40 | 527 | 12.3 | 9.3 | 3.1 | 86.5 | 18.5 |

The best results were obtained in Example 11, which provided an etch rate of 481 nm/min, an etching selectivity ratio exceeding 16 for etching dielectric relative to polysilicon, and exceeding 11.8 for photoresist. The profiles of the features 45 etched in the dielectric layer 20 had angles of about 87°, and the % microloading was about 3. In this example, the volumetric flow ratio of the process gas comprising fluorocarbon:carbon-oxygen:nitrogen-containing gas was 5:6:4. Also, the volumetric flow ratio of the process gas to inert gas was 3:8. In addition the volumetric flow ratio of $CHF_3$ to $C_4F_8$ was about 4:1.

These examples demonstrate that a process according to the present invention provides high etch rates greater than 350 nm/minute, and excellent etching selectivity ratios of about 20:1 for polysilicon and 10:1 for photoresist. The profiles of the features 45 etched in the dielectric layer 20 had substantially straight angles that exceeded 85°, and the % microloading was as low as 3%.

What is claimed is:

1. A method of selectively etching a substrate having a dielectric layer with a resist material thereon, the method comprising the steps of:
    (a) placing the substrate in a process zone;
    (b) forming a plasma from a process gas introduced into the process zone, the process gas comprising (i) fluorocarbon gas for etching the dielectric layer and for forming passivating deposits on the substrate, (ii) carbon-oxygen gas to enhance formation of the passivating deposits, and (iii) nitrogen-containing gas for etching the passivating deposits formed on the substrate,
    wherein the volumetric flow ratio of fluorocarbon:carbon-oxygen:nitrogen-containing gas is selected to provide a dielectric to resist etching selectivity ratio of at least about 10:1, an etch rate microloading of less than about 10%, and a dielectric etch rate of at least about 100 nm/min.

2. The method of claim 1, wherein the volumetric flow ratio of fluorocarbon:carbon-oxygen:nitrogen-containing gas is selected so that the rate of formation of passivating deposits is approximately equal to the rate of removal of the passivating deposits.

3. The method of claim 1, wherein the substrate further comprises an underlayer below the dielectric layer, the underlayer is selected from the group consisting of a polysilicon, monocrystalline silicon, titanium silicide, diffusion barrier, or anti-reflective layer, and wherein the volumetric flow ratio of fluorocarbon:carbon-oxygen:nitrogen-containing gas is selected to provide a dielectric to underlayer etching selectivity ratio of at least about 20:1.

4. The method of claim 1, wherein the process gas etches features having sidewalls in the dielectric layer, and wherein the volumetric flow ratio of fluorocarbon:carbon-oxygen:nitrogen-containing gas is selected so that the sidewalls of the etched features form angles of at least about 85° with a surface of the dielectric layer.

5. The method of claim 1, wherein the volumetric flow ratio of fluorocarbon:carbon-oxygen:nitrogen-containing gas is from about 7:8:4 to about 3:4:4.

6. The method of claim 4, wherein the volumetric flow ratio of fluorocarbon:carbon-oxygen:nitrogen-containing gas is from about 6:7:4 to about 4:5:4.

7. The method of claim 1, wherein the fluorocarbon gas comprises (i) first fluorocarbon gas containing hydrogen, and (ii) second fluorocarbon gas absent hydrogen.

8. The method of claim 7, wherein the first fluorocarbon gas is selected from the group consisting of $CHF_3$, $CH_3F$, $C_2HF_5$, $CH_2F_2$, $C_2H_4F_2$, and mixtures thereof.

9. The method of claim 7, wherein the second fluorocarbon gas selected from the group consisting of $CF_4$, $C_2F_6$, $C_3F_8$, $C_4F_8$, $C_4F_{10}$, and mixtures thereof.

10. The method of claim 1, wherein nitrogen-containing gas is absent fluorine, and is selected from the group consisting of $N_2$, $N_2O$, $NO_x$ in which x is from about 1 to about 2, and mixtures thereof.

11. The method of claim 1, wherein the flow rate of the carbon-oxygen gas is less than or equal to the flow rate of the fluorocarbon gas.

12. The method of claim 1, wherein inert gas is added to the process gas, the inert gas capable of being activated by the plasma to form sputtering ions that sputter material from the substrate.

13. The method of claim 12, wherein the volumetric flow ratio of the process gas to inert gas is from about 3:1 to about 1:2.

14. The method of claim 12, wherein the inert gas is selected from the group consisting of argon, xenon, neon, krypton, and helium.

15. The method of claim 1, wherein the dielectric layer is selected from the group consisting of silicon dioxide, undoped silicate glass, phophosilicate glass, borophosphosilicate glass, or mixtures thereof.

16. The method of claim 1, wherein the plasma is formed by applying an RF voltage at a power level of from about 100 Watts to about 2000 Watts to process electrodes in the process zone.

17. A method of selectively etching a substrate having (i) a dielectric layer, (ii) an underlayer below the dielectric layer, and (iii) a resist material on the dielectric layer, the method comprising the steps of:

(a) placing the substrate in a process zone;

(b) introducing process gas into the process zone, the process gas comprising (i) fluorocarbon gas for etching the dielectric layer and for forming passivating deposits on the substrate, (ii) carbon-oxygen gas for enhancing formation of the passivating deposits, (iii) nitrogen for etching the passivating deposits formed on the substrate, and (iv) inert gas capable of sputtering material from the substrate; and (c) forming a plasma from the process gas introduced into the process zone to etch the dielectric layer on the substrate at an etch rate of at least about 100 nm/min, with a dielectric to resist etching selectivity ratio of at least about 10:1, and a dielectric to underlayer etching selectivity ratio of at least about 20:1.

18. The method of claim 17, wherein the volumetric flow of flurocarbon gas to nitrogen gas is from about 5:1 to about 1:5.

19. The method of claim 17, wherein the volumetric flow of flurocarbon gas to nitrogen gas is from about 3:1 to about 1:3.

20. The method of claim 17, wherein the volumetric flow rates of the fluorocarbon, carbon-oxygen, nitrogen, and inert gas are selected so that the process gas deposits passivating deposits on the substrate at a rate that is approximately equal to the rate of removal of the passivating deposits.

21. The method of claim 17, wherein the underlayer comprising at least one material selected from the group consisting of polysilicon, monocrystalline silicon, titanium silicide, and silicon nitride.

22. The method of claim 17, wherein the fluorocarbon gas comprises (i) first fluorocarbon gas containing hydrogen, and (ii) second fluorocarbon gas absent hydrogen.

23. The method of claim 22, wherein the first fluorocarbon gas is selected from the group consisting of $CH_3F$, $CHF_3$, $C_2HF_5$, $CH_2F_2$, $C_2H_4F_2$, and mixtures thereof.

24. The method of claim 22, wherein the second fluorocarbon gas is selected from the group consisting of $CF_4$, $C_2F_6$, $C_3F_8$, $C_4F_8$, $C_4F_{10}$ and mixtures thereof.

25. The method of claim 17, wherein the inert gas is selected from the group consisting of argon, xenon, neon, krypton, and helium.

26. A method of selectively etching a dielectric layer on a substrate, the method comprising the steps of:

(a) placing the substrate in a process zone;

(b) introducing process gas into the process zone, the process gas comprising (i) first fluorocarbon gas selected from the group consisting of $CHF_3$, $CH_3F$, $C_2HF_5$, $CH_2F_2$, and $C_2H_4F_2$, (ii) second fluorocarbon gas selected from the group consisting of $CF_4$, $C_2F_6$, $C_3F_8$, $C_4F_8$ and $C_4F_{10}$, (ii) carbon-oxygen gas, (iii) nitrogen, and (iv) inert gas; and (c) forming a plasma from the process gas introduced into the process zone to etch the dielectric layer on the substrate with high etching selectivity.

27. The method of claim 26, wherein the volumetric flow ratio of fluorocarbon:nitrogen is from about 3:1 to about 1:3.

28. The method of claim 26, wherein the volumetric flow ratio of fluorocarbon:nitrogen is from about 2:1 to about 1:2.

29. The method of claim 26, wherein the volumetric flow ratio of the first fluorocarbon gas to the second flurocarbon gas is from about 1:1 to about 10:1.

30. The method of claim 26, wherein the volumetric flow ratio of the first fluorocarbon gas to the second flurocarbon gas is from about 1:1 to about 6:1.

31. The method of claim 26, wherein the flow rate of the carbon-oxygen gas is less than or equal to the combined flow rates of the first and second fluorocarbon gases.

32. The method of claim 26, wherein the inert gas is selected from the group consisting of argon, xenon, neon, krypton, and helium.

33. The method of claim 26, wherein the dielectric layer is selected from the group consisting of silicon dioxide, undoped silicate glass, phophosilicate glass, borophosphosilicate glass, or mixtures thereof.

34. A method of etching a dielectric layer on a substrate, the dielectric layer comprising one or more of oxide and nitride layers, the method comprising the steps of:

(a) placing the substrate in a process zone;

(b) introducing process gas into the process zone, the process gas comprising (i) $CHF_3$, (ii) $C_4F_8$, (iii) CO, (iv) $N_2$, and (iv) inert gas; and (c) forming a plasma from the process gas introduced into the process zone to etch the dielectric layer on the substrate.

35. The method of claim 34, wherein the volumetric flow ratio of $CHF_3$ to $C_4F_8$ is from about 1:1 to about 10:1.

36. The method of claim 34, wherein the volumetric flow ratio of $CHF_3$ to $C_4F_8$ is from about 1:1 to about 6:1.

37. The method of claim 34, wherein the ratio of the combined $CHF_3$ and $C_4F_8$ flow rate to the $N_2$ flow rate is from about 5:1 to about 1:5.

38. The method of claim 34, wherein the ratio of the combined $CHF_3$ and $C_4F_8$ flow rate to the $N_2$ flow rate is from about 3:1 to about 1:3.

39. The method of claim 34, wherein the flow rate of the carbon-oxygen gas is less than or equal to the combined flow rates of the $CHF_3$ and $C_4F_8$ gases.

40. A method of etching a dielectric layer on an underlayer on a substrate, the dielectric layer comprising one or more of oxide and nitride layers, the method comprising the steps of:

(a) placing the substrate in a process zone;

(b) introducing process gas into the process zone, the process gas comprising (i) fluorocarbon gas, (ii) CO gas, and (iii) nitrogen gas; and (c) forming a plasma from the process gas in the process zone to etch the dielectric layer with the formation of passivating deposits on the substrate while simultaneously etching the passivating deposits, for enhanced control of microloading and dielectric layer to underlayer etching selectivity.

41. The method of claim 40 wherein the nitrogen gas is absent fluorine, and is selected from the group consisting of $N_2$, $N_2O$, $NO_x$ in which x is from about 1 to about 2, and mixtures thereof.

42. The method of claim 40 wherein the fluorocarbon gas is selected from the group consisting of $C_2F_6$, $CHF_3$, and mixtures thereof.

43. The method of claim 40 wherein the process gas further comprises Ar.

44. The method of claim 40 wherein the volumetric flow ratio of fluorocarbon, CO and nitrogen gas is selected so that the rate of formation of the passivating deposits is approximately equal to the rate of removal of the passivating deposits.

45. The method of claim 40 wherein the fluorocarbon gas comprises at least two components, the first component selected from the group consisting of $CH_3F$, $CHF_3$, $CH_2F_2$, and $C_2H_4F_2$; and the second component selected from the group consisting of $CF_4$, $C_2F_6$, $C_3F_8$, $C_4F_8$, and $C_4F_{10}$.

46. A method of etching a dielectric layer on an underlayer on a substrate, the dielectric layer comprising one or more of oxide and nitride layers, the method comprising the steps of:

(a) placing the substrate in a process zone;

(b) introducing process gas into the process zone, the process gas comprising (i) fluorine-containing gas, (ii) CO gas, and (iii) nitrogen gas; and (c) forming a plasma from the process gas in the process zone to etch the dielectric layer with the formation of passivating deposits on the substrate while simultaneously etching the passivating deposits, for enhanced control of microloading and dielectric layer to underlayer etching selectivity.

47. The method of claim 46 wherein the nitrogen gas is absent fluorine, and is selected from the group consisting of $N_2$, $N_2O$, $NO_x$, in which x is from about 1 to about 2, and mixtures thereof.

48. The method of claim 46 wherein the fluorine-containing gas is selected from the group consisting of $C_2F_6$, $CHF_3$, and mixtures thereof.

49. The method of claim 46 wherein the process gas further comprises Ar.

50. The method of claim 46 wherein the volumetric flow ratio of fluorine-containing gas, CO gas, and nitrogen gas is selected so that the rate of formation of the passivating deposits is approximately equal to the rate of removal of the passivating deposits.

51. The method of claim 46 wherein the fluorine-containing gas comprises at least two components, the first component selected from the group consisting of $CH_3F$, $CHF_3$, $CH_2F_2$, and $C_2H_4F_2$; and the second component selected from the group consisting of $CF_4$, $C_2F_6$, $C_3F_8$, $C_4F_8$, and $C_4F_{10}$.

* * * * *